United States Patent [19]

Mathew

[11] Patent Number: 4,963,233
[45] Date of Patent: Oct. 16, 1990

[54] GLASS CONDITIONING FOR CERAMIC PACKAGE PLATING

[75] Inventor: Ranjan J. Mathew, San Jose, Calif.

[73] Assignee: National Semiconductor Corporation, Santa Clara, Calif.

[21] Appl. No.: 308,702

[22] Filed: Feb. 9, 1989

[51] Int. Cl.$^5$ .......................... C25D 5/02; C25D 5/34
[52] U.S. Cl. ..................................... 204/15; 204/32.1
[58] Field of Search .................. 204/15, 32.1; 156/663

[56] References Cited

U.S. PATENT DOCUMENTS 4,610,798 9/1986 Burkus ................................. 252/79.2
4,773,940 9/1988 Layher ................................. 134/28

Primary Examiner—T. M. Tufariello
Attorney, Agent, or Firm—Gail W. Woodward; Lee Patch; Michael A. Glenn

[57] ABSTRACT

When ceramic packages are subjected to lead plating the solutions can reduce the glass oxides and produce metallization of the sealing glass. At best, this metallization is unsightly and at worst results in lead shorting. Such metallization can be greatly reduced or avoided by a pretreatment that passivates the glass. The pretreatment comprises an immersion in an aqueous solution of fluoboric acid or ammonium bifluoride. Improved solutions that additionally contain a wetting agent and other additives are disclosed.

4 Claims, 1 Drawing Sheet

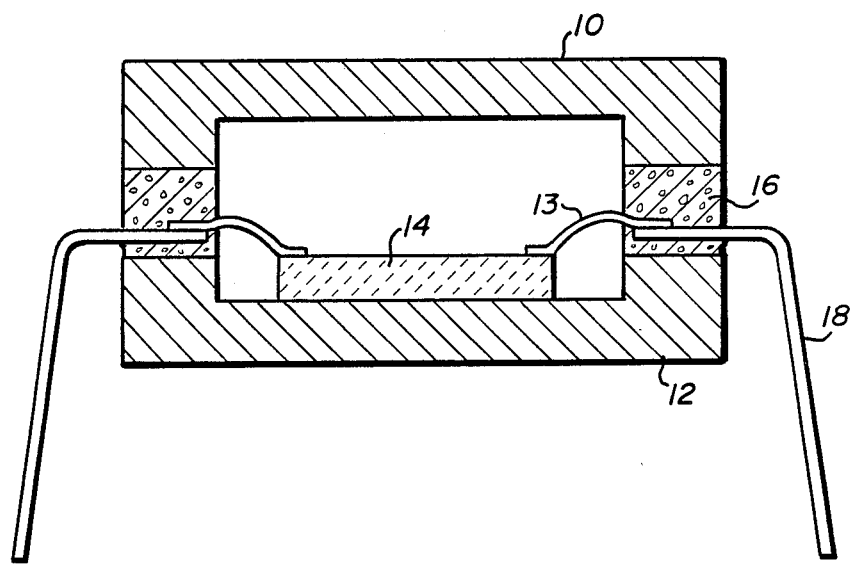

GLASS CONDITIONING FOR CERAMIC PACKAGE PLATING

BACKGROUND OF THE INVENTION

In the fabrication of a ceramic package containing, for example, a semiconductor device, the parts are assembled as shown in the drawing. It is to be understood that the package pins 18 are arrayed in plurality along the edge of the finished package and function to connect the semiconductor device to parts (not shown) that are external to the package. In the package a ceramic base 12 has a metal leadframe 18 attached thereto by means of a glass layer. Then the semiconductor device 14 is mounted upon the base and connections 13 are made between the semiconductor device 14 bonding pads and the leadframe pins 18. Then a ceramic cap 10 having a glass coating is pressed against the upper face of the exposed base. The assembly is heated to above the glass fusion temperature whereby the glass layers on the cap and base fuse together to form a glass seal 16. This forms a sealed unitary structure in which the ceramic cap 10 and base 12 are sealed together. The leadframe and the semiconductor device are sandwiched in between the sealed cap and base so that the lead frame pins extend outward from the ceramic pieces to form package pins. One such structure is referred to as the ceramic dual inline package or CERDIP which is regarded as hermetically sealed. After the seal is completed the metal pins that extend outwardly from the glass seal are typically chemically cleaned and then coated with either a corrosion resistant metal or a solder that will facilitate using the device on a printed wiring circuit board.

The glass seal is an important part of the device manufacture. Since the semiconductor device must be exposed to the glass sealing temperature, it is desirable to employ low melting glasses. Clearly, the conventional sealing glasses that melt above 1000° C. would not be suitable. Accordingly, the well-known solder glasses that melt at a safe temperature are commonly employed. If desired, a well-known devitrifying solder glass can be employed. Such a glass reverts to a ceramic form during the sealing cycle and subsequent to the seal will have a fusion temperature that is far above the sealing temperature.

Commonly used sealing glasses typically include lead oxide which acts to lower the melting temperature. Other oxides ar included to control thermal expansion, light transmission and other physical properties. Unfortunately, these added oxides commonly result in a glass that is prone to chemical attack. For example, the lead oxide may be reduced upon exposure to a reducing ambient and metallic lead will then be present upon the glass surface. At best, the lead will discolor the glass. A sufficient amount will act to short the leads extending out of the package. Such shorting can be catastrophic. In particular, it has been found that the solutions used to plate the leads contain sufficient reducing chemicals to produce a glass attack that results in lead shorting. In the past, this has greatly limited the choice of glasses that will have a suitable sealing temperature. It has been found that lead shorting is a substantial problem particularly in the production of high lead count packages where the space between leads is small.

SUMMARY OF THE INVENTION

It is an object of the invention to treat the seal glass in a ceramic package and condition it to prevent the production of metallization during lead plating.

It is a further object of the invention to passivate the glass in a ceramic package so that lead shorts do not develop during lead plating.

It is a still further object of the invention to treat the glass seal in a ceramic package with a solution containing fluoride or fluoborate to etch and passivate the glass surface prior to lead plating.

These and other objects are achieved as follows: Ceramic packages are created using a low melting temperature glass and the leads are solder-plated as a last production step. Prior to the plating the packages are immersed in a glass etch that contains fluoboric acid or ammonium bifluoride. The packages are then subjected to a succession of acid and water rinses to clean the metal leads which are then electroplated with tin. After rinsing and drying the packages, when examined under a microscope, displayed no surface metal on the glass.

BRIEF DESCRIPTION OF THE DRAWING

The single FIGURE of drawing is a cross-section of a ceramic semiconductor package.

DESCRIPTION OF THE INVENTION

Ceramic packages were created using a glass designated as T-187 obtainable from the Iwaki Glass Co. It seals at about 342° C. The glass is a low melting mixture consisting mainly of lead and boric oxides and contains cordierite to provide a post seal expansion of $68 \times 10^{-7}$/° C. It also contains a tin-titanium oxide solid solution and a black pigment for opacification. The sealed products were subjected to an aqueous solution containing 10% fluoboric acid, 5% hydrogen peroxide and 0.1% anioni wetting agent. A thirty second immersion produces the desired result. The parts could then be water rinsed for two minutes and subjected to the conventional lead cleaning and plating process. A typical cleaning and plating example is as follows:

A one minute immersion in 50% sulfuric acid at 90° C. a two minute water rinse. A one minute immersion in an aqueous solution of oxalic acid and hydrogen peroxide. A two minute water rinse. A one minute immersion in an aqueous 10% sulfuric acid followed by immersion in a tin electroplating solution. The packages were electroplated for about seventeen minutes at about 108 amperes per square meter at room temperature. After a five minute water rinse the packages are immersed in an EDTA chelate solution for one minute, water rinsed for five minutes and dried.

The tin plated packages were examined visually through a 20–30× microscope to see if any metallization was present on the glass. When the fluoboric acid solution was employed no metal was visible. Without such treatment surface metal could be observed.

The fluoboric acid bath could be replaced by an ammonium bifluoride bright dip comprising an aqueous solution containing 0.1 to 50 g/l ammonium bifluoride, 0.1 to 50 g/l urea, 0.1 to 10 g/l oxalic acid, 0.1 to 5 g/l sodium benzoate, 0.1 to 50% hydrogen peroxide and 0.1 to 1% wetting agent. The preferred solution contains about 10 g/l ammonium bifluoride, 10 g/l urea, 5 g/l oxalic acid, 1 g/l sodium benzoate, 10% hydrogen peroxide and 0.5% wetting agent.

In other tests 56-lead ceramic packages were prepared and processed without the fluoboric acid or bifluoride pretreatment as set forth in the following examples.

EXAMPLE 1

The standard cleaning and plating sequence was employed. 100% of the leads examined showed metallization.

EXAMPLE 2

The standard cleaning and plating sequence was employed except that a 15-second immersion in 1% nitric acid was added. 81% of the leads showed metallization.

EXAMPLE 3

The conditions of Example 2 were employed except that used sulfuric acid was employed. This was acid that had previously been used to process 80 thousand packages. 72% of the leads showed metallization.

EXAMPLE 4

The conditions of Example 2 were employed except that used oxalic acid was employed. This was acid that had previously been used to process 40 thousand packages. 35% of the leads showed metallization.

EXAMPLE 5

The standard cleaning and plating sequence was employed except that a 15-second immersion in 2% nitric acid was added. 11% of the leads showed metallization.

EXAMPLE 6

The standard cleaning and plating sequence was employed except that a 30-second immersion in 2% nitric acid was added. 4.2% of the leads showed metallization.

EXAMPLE 7

The standard cleaning and plating sequence was employed except that a 15-second immersion in used 1% nitric acid was employed. This was nitric acid that had been used to process 20 thousand packages. 6.7% of the leads showed metallization.

EXAMPLE 8

The standard cleaning and plating sequence was employed except that a 1% nitric acid and an ammonium bifluoride bright dip was added. 2.5% of the leads showed metallization.

EXAMPLE 9

The standard cleaning and plating plating sequence was employed except that a fluorboric acid immersion was added. 2 5% of the leads show metallization.

The above examples show that ammonium bifluoride and fluoboric acid immersions are relatively effective. In observing the metallization it was noted that the glass between the two ceramic members was recessed slightly, as shown in the drawing, and that metallization occurred mainly in the recess. It is believed that this is why the inclusion of the wetting agent was effective in improving the performance of the preferred embodiment.

The invention has been described in detail. When a person skilled in the art reads the foregoing description, alternatives and equivalents, within the spirit and intent of the invention, will be apparent. Accordingly, it is intended that the scope of the invention be limited only by the claims that follow.

I claim:

1. In the processing of glass-sealed ceramic packages wherein the sealed metal package leads are subjected to cleaning and plating solutions, the improvement comprising:

subjecting the package to a solution of ammonium bifluoride or fluoboric acid in sufficient concentration to ensure that glass seal metallization is minimized during a subsequent metal plating operation.

2. The improvement of claim 1 wherein said fluoboric acid solution comprises about 10% fluoboric acid, about 5% hydrogen peroxide and about 0.1% anionic wetting agent.

3. The improvement of claim 1 wherein said ammonium bifluoride solution comprises an aqueous solution of about 10 g/l ammonium bifluoride, 10 g/l urea 5 g/l oxalic acid, 1 g/l sodium benzoate, 10% hydrogen peroxide and 0.5 g/l wetting agent.

4. The improvement of claim 3 wherein said ammonium bifluoride solution comprises an aqueous solution of about 0.1-50 g/l ammonium bifluoride, 0.1-50 g/l urea, 0.1/10 g/l oxalic acid, 0.1-5g/l sodium benzoate, 0.1-50% hydrogen peroxide and 0.1-1% wetting agent.

* * * * *